US006720833B2

(12) United States Patent
Kobayashi et al.

(10) Patent No.: US 6,720,833 B2
(45) Date of Patent: Apr. 13, 2004

(54) MODULATOR AND OSCILLATOR FOR MICROWAVE AND MILLIWAVE USE

(75) Inventors: Bun Kobayashi, Tokyo (JP); Masahiro Akiyama, Kyoto (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/020,187

(22) Filed: Dec. 18, 2001

(65) Prior Publication Data

US 2002/0105390 A1 Aug. 8, 2002

(30) Foreign Application Priority Data

Feb. 8, 2001 (JP) ........................................ 2001 032434

(51) Int. Cl.[7] .............................. H03B 5/18; H01P 7/10
(52) U.S. Cl. .............. 331/96; 331/117 D; 331/107 DP; 331/177 V; 333/219.1; 333/235
(58) Field of Search .................. 331/36 C, 96–102, 331/117 D, 107 DP, 107 SL, 175, 177 R, 177 V; 333/219.1, 235

(56) References Cited

U.S. PATENT DOCUMENTS 4,488,124 A * 12/1984 Yoshimura ............ 331/107 DP

OTHER PUBLICATIONS

H. Mitsumoto et al., "GaAs FET Direct Frequency–modulators for 42–GHz–band HDTV Radio Cameras and 7–GHz–band Field Pick–up Transmitters" IEEE Male Type Terminals Digest, pp. 663–666, 1993.

* cited by examiner

Primary Examiner—David C. Mis
(74) Attorney, Agent, or Firm—Volentine Francos, PLLC

(57) ABSTRACT

The present invention provides a modulator which has a high degree of modulation and a good modulation sensitivity. The modulator comprises an oscillating circuit and a resonator portion, and this resonator portion comprises a reflective circuit board, a coupling line which is disposed on the reflective circuit board, a coupled load which is coupled to one end of the coupling line, a dielectric resonator which is disposed on the reflective circuit board and which is magnetically coupled with the coupling line, a window portion which is formed in the undersurface of the reflective circuit board directly beneath the coupling line, a waveguide resonator which is disposed on the undersurface of the reflective circuit board in the area that includes the window portion, and which is magnetically coupled with the coupling line, and a varactor diode which is inserted between the opposite signal conductor surfaces and of the waveguide resonator, and to which the input modulating signal terminal is connected. The other end of the coupling line constitute the output port of the resonator portion, and is connected to the input port of the oscillating circuit, and the end portion of the coupled load that is not coupled to the abovementioned coupling line is grounded.

11 Claims, 5 Drawing Sheets

MODULATOR AND OSCILLATOR FOR MICROWAVE AND MILLIWAVE USE

BACKGROUND OF THE INVENTION

1. Field of the Invention

The present invention relates to a high-speed modulator and oscillator for microwave and milliwave use, and more particularly to a modulator which is superior in terms of high-frequency stability and which has a high degree of modulation.

2. Description of Related Art

Conventional modulators for microwave and milliwave use have been described in the literature (H. Mitsumoto, et al. "GaAs FET Direct Frequency-Modulators for 42-GHz-Band HDTV Radio Cameras and 7-GHz-Band Field Pick-up Transmitters", IEEE MALE TYPE TERMINAL-S Digest, pp. 663–666, 1993).

The structure of the modulators disclosed in the above literature is shown in FIG. 5. The modulator 100 comprises an oscillating circuit 102 and a resonator portion 104. The resonator portion 104 comprises a reflective circuit board 106, a coupling line 108 which is formed on the surface of this board 106, a coupled load 110 which is coupled to one end 108a of the coupling line 108, a dielectric resonator 112 which is disposed on the surface of the board 106 so that said resonator is magnetically coupled with the coupling line 108, a λ/2 line (λ is the wavelength) 114 which is magnetically coupled with the dielectric resonator 112, and two varactor diodes 116 and 118 which are respectively connected to both ends 114a and 114b of the λ/2 line 114. The λ/2 line 114 is disposed in a position which is located on the surface of the board 106, and which is located on the opposite side of the dielectric resonator 112 from the above-mentioned coupling line 108.

The oscillating circuit 102 supplies a negative resistance to the output port of the resonator portion 104 constituting the other end 108b of the coupling line 108 in the desired oscillation frequency band. As a result, the dielectric resonator 112 resonates, so that a high-reflection signal wave appears at the output port 108b from the coupling line 108. On the other hand, in frequency bands other than the desired oscillation frequency band, the dielectric resonator 112 does not resonate. Accordingly, a low-reflection signal wave appears at the output port 108b as a result of the action of the coupled load 110.

Furthermore, in this modulator 100, the dielectric resonator 112 is disposed on the upper surface of the board 106 between the coupling line 108 and the λ/2 line 114. This dielectric resonator 112 is magnetic coupled with both the coupling line 108 and the λ/2 line 114. Accordingly, the resonance frequency of the dielectric resonator 112 is affected by the λ/2 line 114. Furthermore, varactor diodes 116 and 118 are coupled to both ends 114a and 114b of the λ/2 line 114. Accordingly, the capacitances of the varactor diodes 116 and 118 vary according to the magnitude of the modulating wave that is input into the λ/2 line 114, and as a result, the resonance frequency of the dielectric resonator 112 varies. Accordingly, the frequency and phase of the peak of the reflected wave that appears at the output port 108b vary according to the modulating signal. The oscillation frequency that is output from the oscillating circuit 102 can be modulated by this variation.

In this modulator 100 described in the literature, the frequency width of the oscillation frequency that is modulated is broadened as a result of the provision of two varactor diodes 116 and 118. Specifically, this modulator is advantageous in that a high degree of modulation can be obtained.

However, the following problems occur in the abovementioned modulator 100:

The dielectric resonator 112 is magnetically coupled with the coupling line 108 and λ/2 line 114. Since the λ/2 line 114 is formed by a strip line with a low resonance Q value, the Q value of the dielectric resonator 112 is affected by the Q value of the λ/2 line 114 so that the Q value of the dielectric resonator 112 is lowered. As a result, the stability of the peak frequency of the reflected wave that appears at the output port 108b of the resonator portion 104 is lost. Accordingly, the stability of the oscillation frequency is also lost. This means that the modulation sensitivity drops.

SUMMARY OF THE INVENTION

Accordingly, an object of the present invention is to provide a modulator which has a high degree of modulation and a good modulation sensitivity.

Furthermore, a further object of the present invention is to provide a modulator which is capable of modulation at a stable oscillation frequency.

In order to achieve these objects, the modulator of the present invention comprises a resonator portion and an oscillating circuit which have the constructions described below. Furthermore, the resonator portion comprises a reflective circuit board, a coupling line which is disposed on a reflective circuit board, a coupled load which is coupled to one end of the coupling line, a dielectric resonator which is disposed on the reflective circuit board and which is magnetically coupled with the coupling line, a window portion which is formed in the undersurface of the reflective circuit board directly beneath the coupling line, a waveguide resonator which is disposed on the undersurface of the reflective circuit board in the area that includes the window portion, and which is magnetically coupled with the coupling line, and a varactor diode which is inserted between the opposite signal conductor surfaces of the waveguide resonator, and to which the input signal terminal is connected. Furthermore, the other end of the coupling line constitutes the output port of the resonator portion, and this output port is connected to the input port of the oscillating circuit. Moreover, the side of the coupled load that is not coupled to the coupling line is grounded.

The operating principle of the modulator constructed as described above is similar to that of a conventional modulator. In the desired oscillation frequency band, a negative resistance is supplied to the output port of the reflective circuit board from the oscillating circuit. As a result, so that a high-reflection wave appears at the output port from the coupling line. This magnitude and phase of this reflected wave are determined by the dielectric resonator, which has a high Q value. Furthermore, this reflected wave is also affected by the waveguide resonator that is magnetically coupled with the coupling line.

Specifically, both the dielectric resonator and the waveguide resonator are magnetically coupled with the coupling line. As a result, the resonance frequency of the dielectric resonator and the resonance frequency of the waveguide resonator coincide with the desired frequency. Accordingly, the impedance of the resonator portion with respect to the desired frequency (nearby frequencies) is increased. Consequently, the reflection to the coupling line is increased.

On the other hand, the magnetic coupling of the waveguide resonator and dielectric resonator to the coupling line is decreased with respect to frequencies that are not the desired frequency. As a result, the impedance of the resonator portion is also decreased, so that the coupling line shows impedance matching with the coupled load. Consequently, the reflection at the output port of the reflective circuit board is reduced, so that the oscillating circuit does not oscillate.

Thus, by making the resonator that causes coupled modulation with the dielectric resonator a waveguide resonator which has a Q value that is higher than that of the λ/2 line, it is possible to maintain the Q value of the resonator portion in a high state. Accordingly, the oscillation frequency can be stabilized. Furthermore, the capacitance of the varactor diode of the waveguide resonator varies according to the modulating signal. Modulation is accomplished by means of this variation in capacitance. Accordingly, modulation at a stable oscillation frequency can be realized.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1:
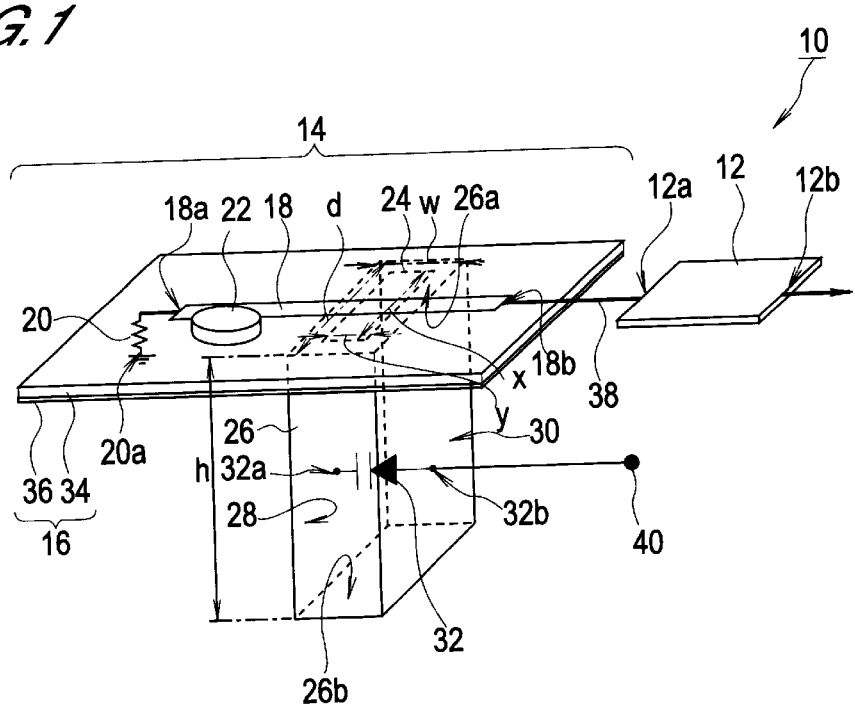
FIG. 1 is a schematic perspective view which shows the construction of a first embodiment of the modulator.

Embodiments of the present invention will be described below with reference to the attached figures. Furthermore, the respective figures merely show the shapes, sizes and positional relationships of the respective constituent components to a degree that allows understanding of the present invention; accordingly, these figures do not limit the invention to the examples that are graphically illustrated here.

First Embodiment

As a first embodiment, the modulator for microwave and milliwave use provided by the present invention will be described with reference to FIGS. 1 and 2.

The modulator 10 of this embodiment comprises an oscillating circuit 12 and a resonator portion 14. A common oscillating circuit is used as the oscillating circuit 12. Accordingly, the detailed construction of this oscillating circuit is omitted from FIGS. 1 and 2.

For example, the oscillating circuit 12 may be an MMIC (microwave monolithic integrated circuit) which contains a transistor amplifying element. Feedback is applied to the input port 12a of the oscillating circuit 12 only in the desired frequency band. Furthermore, if a resonator with a high Q value is connected to this oscillating circuit 12 from the outside, oscillation can be accomplished at the desired resonance frequency (desired frequency band). As a result, oscillating power is output from the output port 12b.

Figure 2:
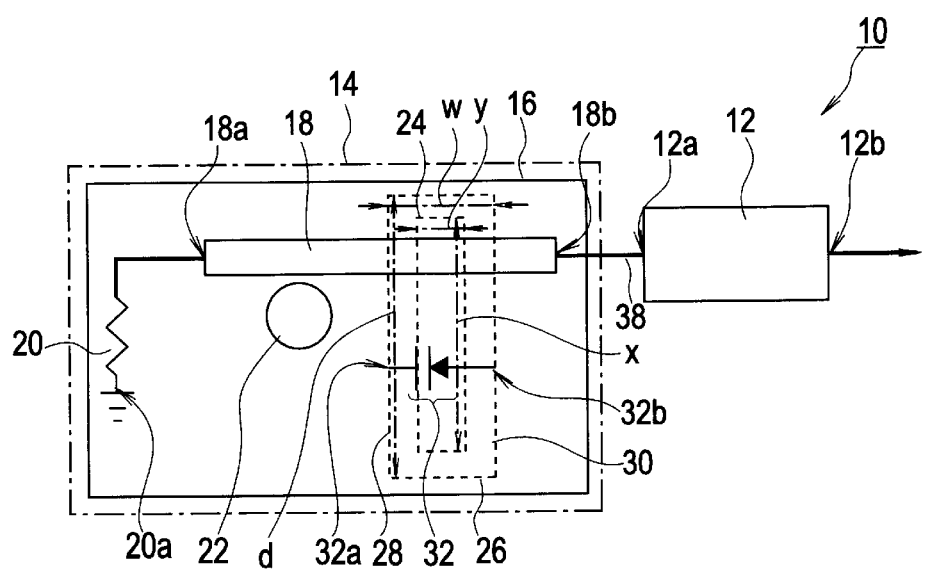
FIG. 2 is a schematic plan view which shows the construction of this first embodiment of the modulator.

Furthermore, the resonator portion 14 that is connected to the oscillating circuit 12 comprises a reflective circuit board 16, a coupling line 18 which is disposed on the reflective circuit board 16, a coupled load 20 which is coupled to one end 18a of this coupling line 18, a dielectric resonator 22 which is disposed on the reflective circuit board 16, and which is magnetically coupled to one end of the coupling line 18, a window portion 24 which is formed in the undersurface of the reflective circuit board 16 directly beneath the coupling line 18, a waveguide resonator 26 which is disposed on the undersurface of the reflective circuit board 16 in the area that includes the window portion 24, and which is magnetically coupled with the coupling line 18, and a varactor diode 32 which is inserted between the opposite signal conductor surfaces 28 and 30 of the waveguide resonator 26, and whose terminal on the side of the signal conductor surface 30 is input signal terminal is connected to the input modulating signal terminal 40 (see FIGS. 1 and 2).

The reflective circuit board 16 is constructed from a dielectric board 34 and a ground plate 36 which is formed on the undersurface of this board 34 (see FIG. 1). A ceramic board as typified by alumina ($Al_2O_3$), a polymer board consisting of Teflon or the like, or a quartz board, may be used as the dielectric board 34. Furthermore, it is advisable that the ground plate 36 be a metal film.

A coupling line 18 consisting of a metal film is formed with a linear shape on the upper surface of the reflective circuit board 16. This coupling line 18 has a specified impedance; for example, this impedance is set at 50 Ω in the present embodiment. A coupled load 20 is connected to one end 18a of the coupling line 18. The resistance value of this coupled load 20 is set at the same value as the impedance of the coupling line 18. The end portion 20a of the coupled load 20 on the side that is not connected to the coupling line is connected to the ground plate 36 of the reflective circuit board 16. In other words, this end portion 20a is grounded. Furthermore, the other end 18b of the coupling line 18 constitutes the output port of the resonator portion 14. This other end 18b is electrically connected to the input port 12a of the oscillating circuit 12 by (for example) a wire 38 or ribbon 38.

Furthermore, a dielectric resonator 22 is disposed on the upper surface of the reflective circuit board 16. This dielectric resonator 22 is formed in position that is magnetically coupled with the coupling line 18. In this embodiment, a cylindrical dielectric resonator is used as the dielectric resonator 22.

Furthermore, a window portion 24 is formed in the undersurface of the reflective circuit board 16 directly beneath the coupling line 18. In this embodiment, the window portion 24 is formed only in the ground plate 36 that constitutes a part of the reflective circuit board 16. This window portion 24 is a window which is formed for the purpose of magnetically coupling the waveguide resonator 26 formed on the undersurface of the reflective circuit board 16 with the coupling line 18. Accordingly, the position in which the window portion 24 is formed is a position located directly beneath the coupling line 18. Furthermore, the size of the window portion 24 is set so that this size is smaller than the size of the contact surface 26a of the waveguide resonator 26 with the reflective circuit board 16. Moreover, the size and shape of this window portion 24 are designed so that the waveguide resonator 26 and coupling line 18 are magnetically coupled at the desired oscillation frequency, and so that the magnetic coupling of the waveguide resonator 26 and coupling line 18 is insufficient at frequencies other than the specified oscillation frequency.

Furthermore, the window portion 24 may also be formed through both the dielectric board 34 and the ground plate 36.

However, if the coupling line 18 is exposed from the window portion 24, the strength of the coupling line 18 drops; accordingly, the window portion 24 is preferably formed only in the ground plate 36.

In this embodiment, the window portion 24 is formed as a rectangular window portion 24 which has a length x of 0.4 cm in the longitudinal direction, and a length y of 0.1 cm in the lateral direction.

Furthermore, the contact surface 26a contacts the area including the abovementioned window portion 24 on the undersurface of the reflective circuit board 16, and the surface 26b on the opposite side from the contact surface 26a is a short-circuited end surface. Moreover, in a case where the contact surface 26a of the waveguide resonator 26 is the upper surface, and the short-circuited end surface 26b is bottom surface, the side surfaces are signal conductor surfaces. A varactor diode 32 is inserted between the two opposite surfaces 28 and 30 located in the direction of the straight line of the coupling line 18 among these signal conductor surfaces. One end 32a of the varactor diode 32 is electrically connected to one signal conductor surface 28, while the other end 32b passes through the waveguide resonator 26, and passes through the other signal conductor surface 30. Furthermore, this other end 32b is connected to the input modulating signal terminal 40. Moreover, the waveguide resonator 26 is formed in such a shape that this resonator resonates at a desired frequency.

In this embodiment, for example, in a case where the resonance frequency is approximately 19 GHz, a waveguide resonator 26 with a rectangular solid shape in which one width d forming the contact surface 26a is 1.1 cm, the other width w is 0.4 cm (see FIG. 2) and the height h is 1.1 cm, is used (see FIG. 1).

In this embodiment, the waveguide resonator 26 is set to resonate in (for example) the TE101 mode.

Next, the operation of the first embodiment of the modulator 10 will be described.

First, the oscillation operation in a case where no modulating signal is applied to the input modulating signal terminal 40 as an input signal will be described.

The oscillating circuit 12 feeds back an oscillating current that is close to the desired oscillation frequency band to the output port 18b of the resonator portion 14. Accordingly, the resonator portion 14 resonates in the abovementioned desired frequency band, so that a high-reflection wave appears at the output port 18b from the coupling line 18. Furthermore, if the phase is the desired phase, an oscillating signal is output from the oscillating circuit 12. The magnitude and phase of this reflected wave are affected by the dielectric resonator 22 and waveguide resonator 26. Specifically, the dielectric resonator 22 and waveguide resonator 26 are respectively magnetically coupled with the coupling line 18. Accordingly, the resonance frequencies of the dielectric resonator 22 and waveguide resonator 26 are the desired frequencies. Consequently, the impedance of the resonator portion 14 with respect to oscillating currents that are close to the desired frequency band is large. As a result, the reflection to the coupling line 18 is increased. Furthermore, both the dielectric resonator 22 and waveguide resonator 26 have a high Q value. Accordingly, the oscillation frequency of the resonator portion 14 as a whole can be stabilized.

On the other hand, in the case of oscillating currents with frequencies outside the desired frequency band, the magnetic coupling of the dielectric resonator 22 and waveguide resonator 26 with respect to the coupling line 18 is reduced. As a result, the impedance of the resonator portion 14 is reduced. Accordingly, since the impedance of the coupling line 18 is matched with that of the coupled load 20, the reflection to the coupling line 18 is reduced. As a result, the oscillating circuit 12 does not oscillate.

Next, the oscillation frequency is modulated by applying a modulating signal to the input modulating signal terminal 40.

In a case where the voltage of the modulating signal is high (e. g., 12 V), the capacitance of the varactor diode 32 is (for example) 0.1 pF. The impedance of the varactor diode 32 is high, i. e., 40 Ω at a frequency of 40 GHz. The oscillation in this state has a frequency of 40 GHz.

Next, in a case where the voltage of the modulating signal is low (e. g., 1 V), the capacitance of the varactor diode 32 is increased; here, for example, this capacitance is 1 pF. Furthermore, the impedance is approximately 4 Ω in the 40 GHz band. As a result, the resonant state of the waveguide resonator 26 is altered, so that the reflection value and phase of the signal wave at the output port 18b of the resonator portion 14 match the oscillation state at a higher frequency. As a result, the oscillation frequency of the oscillating circuit 12 is increased. In other words, this means that the oscillation frequency is modulated by the modulating signal.

In the modulator 10 of this first embodiment, a window portion 24 is disposed in the undersurface of the reflective circuit board 16 in a position that is directly beneath the coupling line 18, and modulation is realized by magnetically coupling the coupling line 18 and the waveguide resonator 26 that contains the varactor diode 32 via this window portion 24. Like the dielectric resonator 22, this waveguide resonator 26 has a high Q value; accordingly, there is no danger that the effective Q value of the resonator portion 14 will be lowered. Consequently, the oscillation frequency can be maintained at a stable value. As a result, a modulator 10 with a good modulation sensitivity can be realized. Furthermore, since the oscillation frequency is stabilized, phase noise of the oscillating power that is output can be reduced.

Second Embodiment

Figure 3:
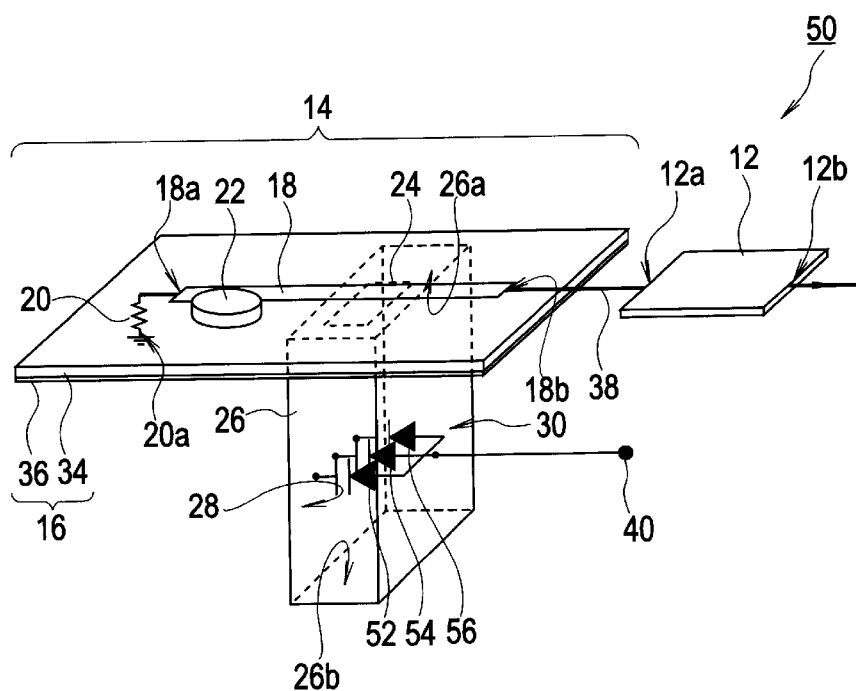
FIG. 3 is a schematic perspective view which shows the construction of a second embodiment of the modulator.

A second embodiment of the modulator will be described with reference to FIG. 3.

The following description will be given to points that differ from the first embodiment; a detailed description will be omitted in the case of points that are similar to the first embodiment. Furthermore, in FIG. 3, constituent components that are the same as in FIGS. 1 and 2 are labeled with the same symbols.

Like the modulator of the first embodiment, the modulator 50 of this second embodiment comprises an oscillating circuit 12 and a resonator portion 14. Furthermore, the resonator portion 14 comprises a reflective circuit board 16, a coupling line 18 which is disposed on the reflective circuit board 16, a coupled load 20 which is coupled to one end 18a of this coupling line 18, a dielectric resonator 22 which is disposed on the reflective circuit board 16, and which is magnetically coupled with the coupling line 18, a window portion 24 which is formed in the undersurface of the reflective circuit board 16 directly beneath the coupling line 18, a waveguide resonator 26 which is disposed on the undersurface of the reflective circuit board 16 in the area that includes the window portion 24, and which is magnetically coupled with the coupling line 18, and varactor diodes 52, 54 and 56 which are inserted between the opposite signal conductor surfaces 28 and 30 of the waveguide resonator 26 (see FIG. 3).

In this embodiment, a plurality of varactor diodes 52, 54 and 56 are disposed between the opposite signal conductor surfaces 28 and 30. Furthermore, in this example, three varactor diodes are disposed in parallel with respect to the input signal.

In this modulator 50, as in the first embodiment, the modulating signal is applied to the varactor diodes 52, 54 and 56 from the modulating signal input terminal 40. The capacitances of the varactor diodes 52, 54 and 56 vary according to the voltage of this modulating signal. Furthermore, the resonant state of the waveguide resonator 26 is altered as a result of this variation. In this embodiment, since three varactor diodes 52, 54 and 56 are installed, the width of the variation in capacitance caused by the varactor diodes can be broadened. As a result, the width of the modulation of the oscillation frequency, i. e., the maximum frequency shift (Δf) can be increased. Furthermore, since the waveguide resonator 26 and dielectric resonator 22, which have high Q values, are magnetically coupled with the coupling line 18 as in the first embodiment, the oscillation frequency can be stabilized.

Accordingly, in the second embodiment, a modulator 50 which has a high modulation sensitivity and a high degree of modulation can be obtained.

Furthermore, the plurality of varactor diodes 52, 54 and 56 may also be installed on the opposite signal conductor surfaces of the waveguide resonator is series with respect to the input signal. Moreover, the number of varactor diodes installed is not limited to three.

Third Embodiment

Figure 4:
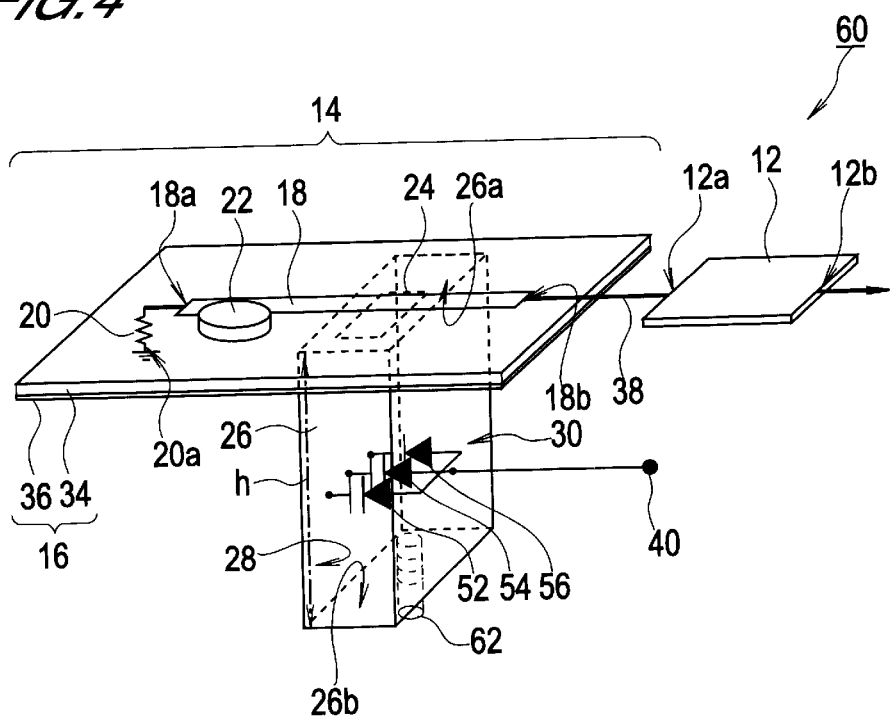
FIG. 4 is a schematic perspective view which shows the construction of a third embodiment of the modulator.
Figure 5:
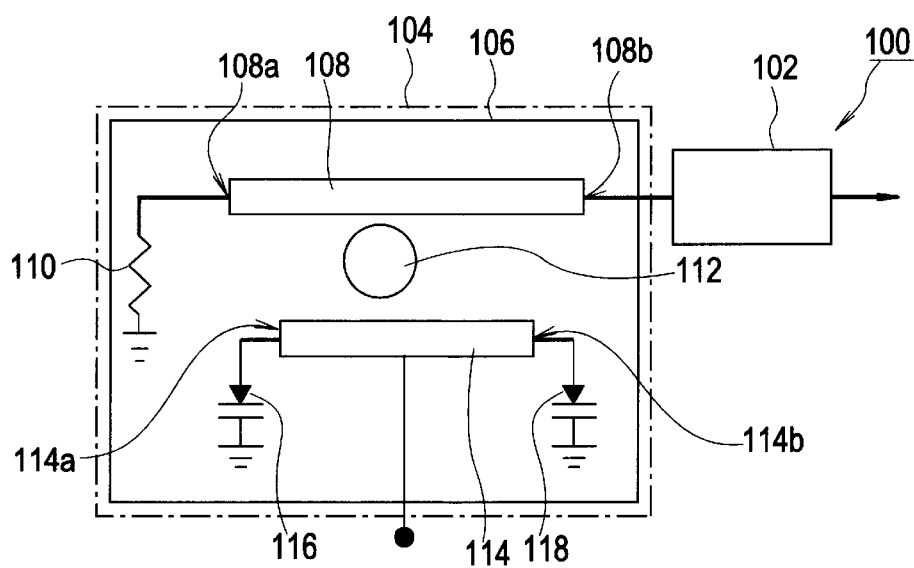
FIG. 5 is a schematic plan view which shows the construction of a conventional modulator.

A third embodiment of the modulator will be described with reference to FIG. 4.

Points that differ from the first and second embodiments will be described below; in the case of points that are the same, a detailed description will be omitted.

The modulator 60 of this third embodiment has a structure that is more or less similar to that of the second embodiment. Specifically, this modulator 60 comprises an oscillating circuit 12 and a resonator portion 14, and the resonator portion 14 comprises a reflective circuit board 16, a coupling line 18 which is disposed on the reflective circuit board 16, a coupled load 20 which is coupled to one end 18a of this coupling line 18, a dielectric resonator 22 which is disposed on the reflective circuit board 16, and which is magnetically coupled with the coupling line 18, a window portion 24 which is formed in the undersurface of the reflective circuit board 16 directly beneath the coupling line 18, a waveguide resonator 26 which is disposed on the undersurface of the reflective circuit board 16 in the area that includes the window portion 24, and which is magnetically coupled with the coupling line 18, and three varactor diodes 52, 54 and 56 which are inserted between the opposite signal conductor surfaces 28 and 30 of the waveguide resonator 26 in parallel with respect to the modulating signal.

Furthermore, in the modulator 60 of this embodiment, a fine adjustment screw 62 is disposed on the short-circuited end surface 26b of the waveguide resonator 26. The tip of this screw 62 faces toward the window portion 24 from the short-circuited end surface 26b. Specifically, the fine adjustment screw 62 is disposed so that this screw faces toward the upper surface 26a (contact surface with the reflective circuit board) from the bottom surface 26b of the waveguide resonator 26. When this fine adjustment screw 62 is turned, the length of the screw 62 that is inserted into the waveguide resonator 26 varies. Furthermore, this screw 62 is connected to the short-circuited end surface 26b of the waveguide resonator 26. Accordingly, the effective distance from the short-circuited end surface 26b to the contact surface 26a with the reflective circuit board 16, which determines the resonance frequency, varies with respect to the resonant electromagnetic waves of the waveguide resonator 26 by an amount equal to the insertion length of the screw 62. As a result, the resonant state of the waveguide resonator 26 varies, so that the oscillation frequency of the modulator 60 can be altered.

Accordingly, in this embodiment, the oscillation frequency of the modulator 60 can be adjusted regardless of the modulation of the oscillation frequency according to the magnitude of the voltage of the modulating signal. In cases where the center frequency of the oscillation frequency following modulation deviates from the desired frequency, this frequency can be accurately adjusted to the desired center frequency of the oscillation frequency by turning the abovementioned fine adjustment screw 62 so that the effective distance from the short-circuited end surface 26b of the waveguide resonator 26 to the contact surface 26a is adjusted.

Furthermore, the insertion length of the screw 62 into the waveguide resonator 26 from the short-circuited end surface 26b is preferably shorter than ¼ the resonance frequency λ.

The height h of the waveguide resonator 26 is set at approximately ½ the resonance frequency λ. Accordingly, the position in the vicinity of the center of the waveguide resonator 26 is approximately ¼ the resonance frequency λ. Since this λ/4 position is the position of maximum intensity of the electric field, there is a danger that resonance will become impossible if the tip end of the fine adjustment screw 62 is located closer to the upper surface 26a than the λ/4 position. Accordingly, the insertion length of the screw 62 is adjusted within a range that is shorter than ¼ the resonance frequency λ.

Furthermore, in this embodiment, the construction of the modulator other than the fine adjustment screw 62 is similar to that of the second embodiment; accordingly, a modulator with a high degree of modulation and a high modulation sensitivity similar to the modulator of the second embodiment can be realized.

Furthermore, in the abovementioned first through third embodiments, a microwave/milliwave oscillator can be formed by omitting the varactor diodes installed in the waveguide resonator, and the input signal terminal connected to the varactor diodes. The oscillation operation of this oscillator is an operation similar to the oscillation operation described in the first embodiment in a state in which no modulating signal is applied. Accordingly, the stability is higher than in a conventional oscillator, and an oscillator which makes it possible to perform oscillation at a frequency at which the phase noise is reduced can be realized. Furthermore, oscillation at the desired center frequency can be accomplished by installing a fine adjustment screw on the short-circuited end surface of the waveguide resonator as in the third embodiment.

Furthermore, in the first through third embodiments, a construction was used in which the dielectric resonator and the coupling line were magnetically coupled, and the waveguide resonator and the coupling line were magnetically coupled. However, it would also be possible to magnetically couple the dielectric resonator and waveguide resonator. As a result, the resonance frequency in the resonator portion shows agreement. By causing this resonance frequency to agree with the desired oscillation frequency of the coupling line, it is possible to increase the reflection to the coupling line. Accordingly, since the Q value of the resonator portion can be maintained in a high state as in the first through third embodiments, the oscillation frequency can be stabilized. As a result, furthermore, the modulation sensitivity can be improved.

Furthermore, in the first through third embodiments, a waveguide resonator with a rectangular shape (rectangular sold shape) was described as an example; however, the same effect as in the abovementioned embodiments can also be obtained even if a cylindrical waveguide resonator is used instead of such a rectangular waveguide resonator.

What is claimed is:

1. A modulator comprising an oscillating circuit and a resonator portion, said resonator portion comprising:

a reflective circuit board;

a coupling line which is disposed on the reflective circuit board;

a coupled load which is coupled to one end of said coupling line;

a dielectric resonator which is disposed on said reflective circuit board, and which is magnetically coupled with said coupling line;

a window portion which is formed in the undersurface of said reflective circuit board directly beneath said coupling line;

a waveguide resonator which is disposed on the undersurface of said reflective circuit board in the region that includes said window portion, and which is magnetically coupled with said coupling line; and a varactor diode which is inserted between the opposite signal conductor surfaces of said waveguide resonator, and to which the input signal terminal is connected, wherein the other end of said coupling line constitutes the output port of the resonator portion, and is connected to the input port of said oscillating circuit, and the side of said coupled load that is not coupled to said coupling line is grounded.

2. The modulator according to claim 1, wherein said reflective circuit board is constructed from a dielectric board and a ground plate that is formed on the surface of said dielectric board.

3. The modulator according to claim 2, wherein said window portion is formed in said ground plate, and the size and shape of said window portion are designed so that when said waveguide resonator and said coupling line are magnetically coupled at a set oscillation frequency, the magnetic coupling of said waveguide resonator and said coupling line is insufficient at frequencies other than said set oscillation frequency.

4. The modulator according to claim 2, wherein said window portion is formed both in said dielectric board and in said ground plate.

5. The modulator according to claim 1, wherein a plurality of said varactor diodes are inserted between said opposite signal conductor surfaces in parallel or series with respect to the input signal.

6. The modulator according to claim 1, wherein a fine adjustment screw is disposed on the short-circuited end surface of said waveguide resonator, the tip of said fine adjustment screw faces toward said window portion from said short-circuited end surface, and the effective distance between the short-circuited end surface and the surface that contacts the undersurface of said reflective circuit board with respect to the resonant electromagnetic waves is varied by turning said fine adjustment screw.

7. An oscillator comprising an oscillating circuit and a resonator portion, said resonator portion comprising:

a reflective circuit board;

a coupling line which is disposed on the reflective circuit board;

a coupled load which is coupled to one end of said coupling line;

a dielectric resonator which is disposed on said reflective circuit board, and which is magnetically coupled with said coupling line;

a window portion which is formed in the undersurface of said reflective circuit board directly beneath said coupling line; and a waveguide resonator which is disposed on the undersurface of said reflective circuit board in the region that includes said window portion, and which is magnetically coupled with said coupling line, wherein the other end of said coupling line constitutes the output port of the resonator portion, and is connected to the input port of said oscillating circuit, and the side of said coupled load that is not coupled to said coupling line is grounded.

8. The oscillator according to claim 7, wherein said reflective circuit board is constituted by a dielectric board and a ground plate that is formed on the undersurface of said dielectric board.

9. The oscillator according to claim 8, wherein said window portion is formed in said ground plate, and the size and shape of said window portion are designed so that when said waveguide resonator and said coupling line are magnetically coupled at a set oscillation frequency, the magnetic coupling of said waveguide resonator and said coupling line is insufficient at frequencies other than said set oscillation frequency.

10. The oscillator according to claim 8, wherein said window portion is formed both in said dielectric board and in said ground plate.

11. The oscillator according to claim 7, wherein a fine adjustment screw is disposed on the short-circuited end surface of said waveguide resonator, the tip of said fine adjustment screw faces toward said window portion from said short-circuited end surface, and the effective distance between the short-circuited end surface and the surface that contacts the undersurface of said reflective circuit board with respect to the resonant electromagnetic waves is varied by turning said fine adjustment screw.

* * * * *